United States Patent [19]

Hamuro

[11] Patent Number: 4,990,817
[45] Date of Patent: Feb. 5, 1991

[54] CHIP TYPE ELECTRONIC PART
[75] Inventor: Mitsuro Hamuro, Nagaokakyo, Japan
[73] Assignee: Murata Manufacturing Co., Ltd., Nagaokako, Japan
[21] Appl. No.: 880,317
[22] Filed: Jun. 30, 1986
[30] Foreign Application Priority Data
  Jul. 8, 1985 [JP] Japan ............................ 60-151081
[51] Int. Cl.$^5$ ........................................... H01L 41/08
[52] U.S. Cl. ................................................... 310/348
[58] Field of Search ................................ 310/348-356
[56] References Cited
U.S. PATENT DOCUMENTS
4,485,325 11/1984 Yamamoto et al. ............ 310/348 X
4,542,315 9/1985 Yamamoto et al. ............ 310/356 X
4,588,918 5/1986 Yamamoto et al. .............. 310/348

Primary Examiner—Mark D. Budd
Attorney, Agent, or Firm—Wenderoth, Lind & Ponack

[57] ABSTRACT

A chip type electronic part which comprises a chip main body of a cylindrical external shape having a circular cross section, and cap terminals also of a circular cross section applied onto opposite ends of the chip main body. The chip main body is covered, on its side peripheral face not applied with the cap terminals, by an outer covering member having a rectangular cross section, with an interval between a side face of the outer covering member and a corresponding side face of each of the cap terminals being set within a range of +0.2 mm to −0.2 mm.

4 Claims, 2 Drawing Sheets

CHIP TYPE ELECTRONIC PART

BACKGROUND OF THE INVENTION

The present invention generally relates to a chip type electronic part such as a chip type piezoelectric resonator or the like, and more particularly, to means for altering the configuration of a so-called circular chip part into a rectangular chip part.

In FIG. 5, there is shown a side sectional view showing one example of a conventional chip type electronic part, which is a so-called circular chip type piezoelectric resonator having a chip main body B of a cylindrical shape, and cap terminals Ta and Tb respectively applied onto opposite ends of said main body B.

More specifically, the known circular chip type piezoelectric resonator in FIG. 5 includes a cylindrical case Ba made, for example, of alumina ceramic material and open at its opposite ends to constitute the chip main body B, a piezoelectric resonator element E of a strip shape accommodated within the case Ba as an electronic part element, the metallic cap terminals Ta and Tb respectively applied onto opposite ends of the case Ba, and electrically conductive bonding material Ma and Mb applied between the cap terminals Ta and Tb and corresponding end portions of the piezoelectric resonator element E for electrical conduction therebetween and also for holding said element E slantwise as shown. This piezoelectric resonator element E is, for example, a two-terminal energy trapped type utilizing the thickness shear vibration mode. One example of such chip type piezoelectric resonator is disclosed, for example, in Japanese Patent Laid-Open Application (Tokkaisho) No. 59-89021.

With respect to the circular chip part as described above, there has been a demand in some cases that for actually mounting such chip part onto a printed circuit board, etc. by a mounting machine, only the external shape of the chip part be changed into a rectangular configuration, with the other specifications thereof left as they are, thereby making it possible to use, for example, a vacuum chuck for a rectangular shape chip part in the mounting machine for mounting the part. In such a case, it is extremely uneconomical to further prepare chip parts having a rectangular external shape in addition to those having the circular external shape.

SUMMARY OF THE INVENTION

Accordingly, an essential object of the present invention is to provide a chip type electronic part having a configuration which may be readily processed as a circular type or a rectangular type for efficient handling in the actual application of the part to the circuit board.

Another important object of the present invention is to provide a chip type electronic part as described above, which is simple in construction and stable in functioning, and can be readily manufactured on a large scale at low cost.

In accomplishing these and other objects, according to one preferred embodiment of the present invention, there is provided a chip type electronic part which includes a chip main body of a cylindrical external shape having a circular cross section, and cap terminals also of a circular cross section applied onto opposite ends of the chip main body. The chip main body is covered, on its, side peripheral face other than where the cap terminals are located, by an outer covering member having a rectangular cross section, with minimum difference between the radius of the cap terminals and the distance from the cylindrical axis of the main body to the side face of the outer covering member being set within a range of +0.2 mm to −0.2 mm.

As described above, according to the present invention, the circular chip part is changed into a rectangular chip part merely by altering the outer covering member which covers the side peripheral face of the chip main body, and moreover, the distance between the side face of the outer covering member and the corresponding side face of the cap member is set within the predetermined range. Accordingly, no inconvenience is experienced even when the part is to be temporarily fixed to a printed circuit board or the like by a bonding agent for subsequent soldering.

By the construction of the present invention as described above, an improved chip type electronic part has been provided through a simple structure, with substantial elimination of disadvantages inherent in the conventional chip parts of the kind.

BRIEF DESCRIPTION OF THE DRAWINGS

These and other objects and features of the present invention will become apparent from the following description replace it with the preferred embodiments thereof taken with reference to the accompanying drawings, in which.

DETAILED DESCRIPTION OF THE INVENTION

Figure 1A:
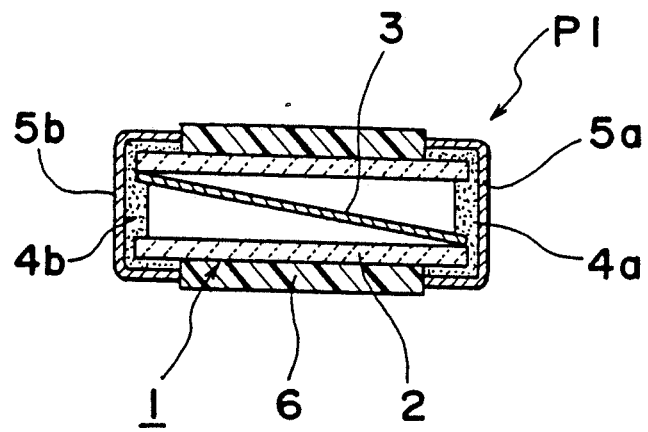
FIG. 1(A) is a cross sectional view showing the construction of a chip type electronic part according to one preferred embodiment of the present invention.

Before the description of the present invention proceeds, it is to be noted that like parts are designated by like reference numerals throughout the accompanying drawings.

Figure 1B:
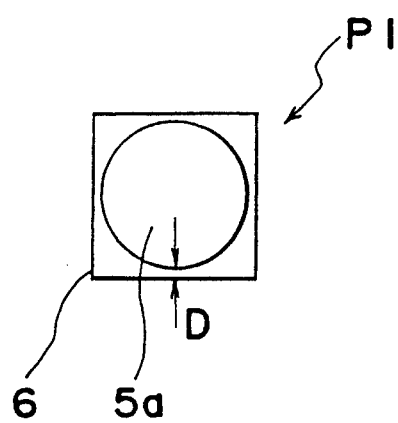
FIG. 1(B) is an end elevational view of the electronic part of FIG. 1(A)

Referring now to the drawings, there is shown in FIGS. 1(A) and 1(B), a chip type electronic part P1 according to one preferred embodiment of the present invention.

Figure 5:
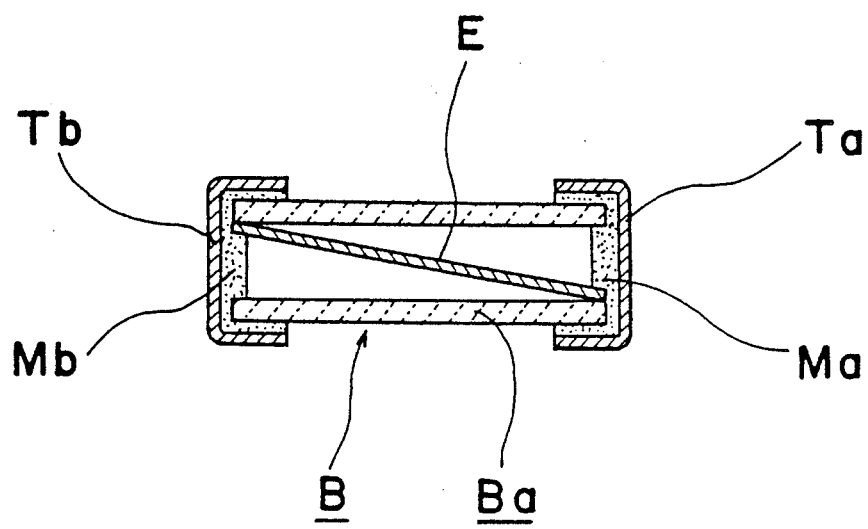
FIG. 5 is a cross sectional view showing one example of a conventional chip type electronic part (already

Generally, in a similar manner as in the known arrangement of FIG. 5, the chip type electronic part Pl of FIGS. 1(A) and 1(B) includes a cylindrical case 2 made of alumina ceramic material or the like and open at its opposite ends which constitutes a main body 1, a piezoelectric resonator element 3 of a strip shape accommodated within the case 2 as an electronic part element, and metallic cap terminals 5a and 5b respectively applied onto opposite ends of the case 2, with electrically conductive bonding material 4a and 4b being applied between the cap terminals 5a and 5b and corresponding end portions of the piezoelectric resonator element 3 for electrical conduction therebetween and also for holding said element 3 slantwise. In this chip type electronic part P1, the portion on the side peripheral face of the main body 1, i.e., circular cylindrical case 2 which is not covered by the cap terminals 5a and 5b is further covered by an outer covering member 6 having a cross section, for example, of a regular square shape to provide a chip part having a rectangular external configuration.

More specifically, in the actual practice, the circular chip part as shown, for example, in FIG. 5 is processed by a molding machine (not shown), and the outer covering member 6 is molded thereonto through employment, for example, of a thermo-setting resin such as epoxy group resin, etc. or thermo-plastic resin such as PPS, Econole (name used in trade and manufactured by Sumitomo Chemical Company Limited of Japan).

Figure 2:
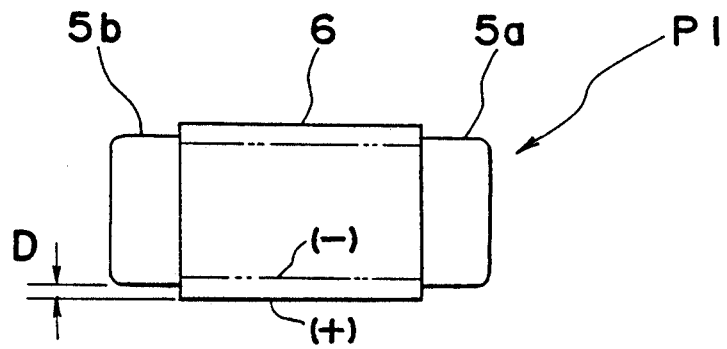
FIG. 2 is a side elevational view of the electronic part of FIGS. 1(A) and 1(B)

In the above structure, as shown in FIG. 2, the minimum difference D between the radius r of the cap terminals 5a and 5b and the distance from the cylindrical axis C of the main body and a side face of the outer covering member 6 is set to be within a range of +0.2 mm to −0.2 mm. In this case, when the side face of the outer covering member 6 protrudes beyond the side face of the cap terminal 5a or 5b (for example, as shown by solid lines in FIG. 2), it is represented as a plus difference (+), while the case contrary to the above (for example, as shown by chain lines in FIG. 2), is denoted as a minus difference (−).

The interval D has been set in the above range for the reason as described hereinbelow.

Figure 3:
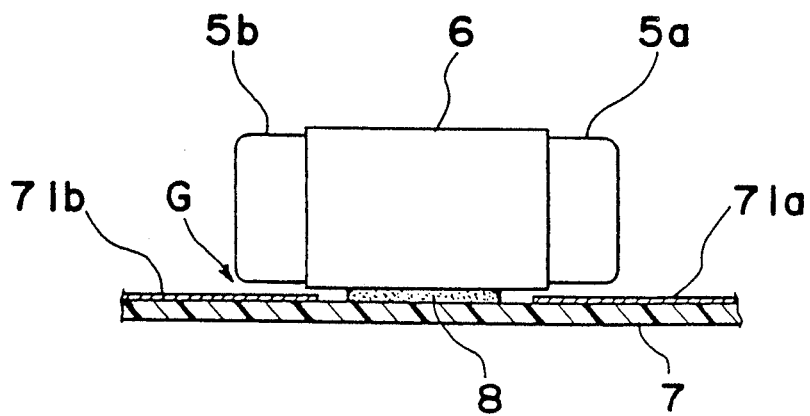
FIG. 3 is a sectional elevation view showing the chip type electronic part of FIGS. 1(A) and 1(B) mounted on a printed circuit board.

Specifically, as shown in FIG. 3, in the case where the cap terminals 5a and 5b are to be respectively soldered to corresponding electrodes 71a and 71b of a printed circuit board 7 by flow solder or the like in the state where, for example, the chip type electronic part P1 is temporarily fixed to the printed circuit board 7 by a bonding agent 8, if the above difference D is larger than +0.2 mm, the gap G between the cap terminals 5a and 5b and the electrodes 71a and 71b becomes too large, with a reduction in the reliability in soldering thereat, while on the contrary, if the difference D is larger than −0.2 mm in the minus side, the temporary bonding by the bonding agent 8 becomes difficult.

As described so far, according to the present invention, it is extremely economical since the chip type electronic part P1 may be readily prepared by merely applying the rectangular outer covering member 6 onto the chip part originally having a round shape. In other words, with respect to the demand for the circular type chip parts or rectangular type chip parts to be used in a process for actually mounting such chip parts, it may be so arranged that the original circular chip parts may be shipped out as they are to fill the requirement for the circular type, while for the requirement of the rectangular type chip parts, it is only necessary to merely apply the outer covering member 6 onto the circular type chip parts. Thus, there is no necessity for producing two kinds of chip parts of the same specification in the circular and rectangular shapes.

Figure 4:
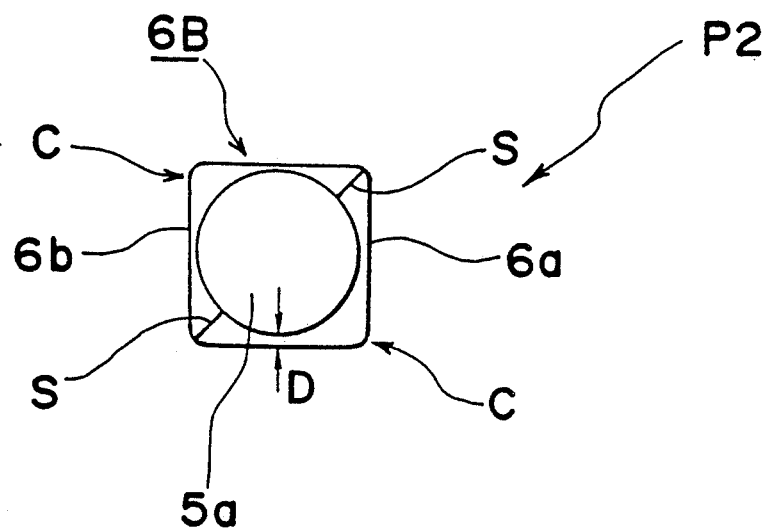
FIG. 4 is an end elevational view of a chip type electronic part according to a modification of the present invention.

Referring further to FIG. 4, there is shown a chip type electronic part P2 according to a modification of the present invention. In the modified chip type electronic part P2 of FIG. 4, the outer covering member 6 in the chip type electronic part P1 of FIGS. 1(A) and 1(B) is replaced by an outer covering member 6B which has a rectangular cross section at the outer side and a circular cross section at the inner side corresponding to the outer peripheral surface of the cylindrical case 2, and is axially divided into a pair of two counter-part portions 6a and 6b which are preliminarily formed. For application, these two counterpart portions 6a and 6b are applied onto the chip main body 1, i.e., cylindrical case 2, and bonded to each other at bonding faces S into one unit. By such means as described above, the outer covering member 6B can be applied onto the chip main body 1 without using the molding process as described with reference to FIGS. 1(A) and 1(B).

The bonding faces S should preferably be provided at portions along a diagonal line as shown in FIG. 4, since the surface area at the bonding portions becomes large so as to increase the bonding strength.

It is needless to say that in the modification of FIG. 4 also, the difference D between the side face of the outer covering member 6B and the corresponding side face of the cap terminal 5a or 5b is set to be within the range of +0.2 mm to −0.2 mm in a similar manner as in the embodiment of FIGS. 1(A) and 1(B).

Furthermore, depending on necessity, each of the corner portions C of the outer covering member 6 or 6B in FIGS. 1(A) and 1(B) or FIG. 4 may be rounded as shown in FIG. 4.

It should be noted that the present invention is not limited in its application to the chip type piezoelectric resonator as described so far, but may widely be applied to any chip type electronic part such as chip type capacitors, resistors, etc.

As is clear from the foregoing description, according to the present invention, rectangular chip type electronic parts may be, readily prepared economically. Moreover, since the difference between the side face of the outer covering member and the corresponding side face of each terminal cap is set within the predetermined range, there is no particular inconvenience for mounting the chip part onto a printed circuit board or the like.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A chip type electronic part which comprises:
   a chip main body of a rigid material having a cylindrical external shape having a circular cross-section;
   cap terminals having a circular cross-section and mounted on the opposite ends of said chip main body and extending along part of the length of the outer cylindrical surface of said chip main body and in contact therewith; and
   a separate outer covering member having a rectangular cross-section and positioned against and covering the outer peripheral surface of said chip main body where the surface is not covered by said cap terminals range for converting the chip type electronic part with a cylindrical external shape of the chip main body to a chip type part with a shape for enabling the coverted chip type part to be adhered to a flat surface.

2. A chip type electronic part as claimed in claim 1, wherein said outer covering member is a molding resin molded onto said chip main body.

3. A chip type electronic part as claimed in claim 1 in which said outer covering member has an inner recess extending axially therethrough having a circular cross-section corresponding to the outer surface of said chip main body, and said outer covering is axially divided by a diametrically extending plane into a pair of complementary portions having opposed bonding faces, said portions being around said chip main body and being bonded to each other at said bonding faces into a single unit.

4. A chip type electronic part as claimed in claim 3 in which said diametrically extending plane extends between corners of the rectangular cross-section, whereby the surface areas of the bonding faces are a maximum.

* * * * *